(12) United States Patent
Yao et al.

(10) Patent No.: US 7,772,701 B2
(45) Date of Patent: Aug. 10, 2010

(54) INTEGRATED CIRCUIT HAVING IMPROVED INTERCONNECT STRUCTURE

(75) Inventors: Chih-Hsiang Yao, Taipei (TW);
Tai-Chun Huang, Hsin-Chu (TW);
Mong-Song Liang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 272 days.

(21) Appl. No.: 11/422,769

(22) Filed: Jun. 7, 2006

(65) Prior Publication Data
US 2007/0284747 A1 Dec. 13, 2007

(51) Int. Cl.
*H01L 23/48* (2006.01)
*H01L 29/40* (2006.01)

(52) U.S. Cl. .................. 257/758; 257/762; 438/107

(58) Field of Classification Search ................ 257/758, 257/762, 276, 508, 532, 535, E23.01, E23.079, 257/E23.141, E23.179; 438/107
See application file for complete search history.

(56) References Cited

U.S. PATENT DOCUMENTS

| | | | |
|---|---|---|---|
| 5,726,485 A * | 3/1998 | Grass | 257/532 |
| 6,261,944 B1 * | 7/2001 | Mehta et al. | 438/624 |
| 6,355,950 B1 * | 3/2002 | Livengood et al. | 257/276 |
| 6,838,332 B1 * | 1/2005 | Sanchez et al. | 438/239 |
| 7,462,509 B2 * | 12/2008 | Bernstein et al. | 438/107 |
| 2005/0082577 A1 * | 4/2005 | Usui | 257/211 |
| 2007/0031697 A1 * | 2/2007 | Test et al. | 428/675 |

* cited by examiner

*Primary Examiner*—Theresa T Doan
(74) *Attorney, Agent, or Firm*—Duane Morris LLP

(57) ABSTRACT

An improved integrated circuit structure and method of making the same is provided. The integrated circuit structure comprises a substrate, the substrate having a top surface and a bottom surface. The top surface has a circuit device formed thereon. The structure includes a plurality of metallization layers, a bonding structure formed over the bottom surface and a conductive interconnect structure formed through said substrate.

21 Claims, 3 Drawing Sheets

US 7,772,701 B2

INTEGRATED CIRCUIT HAVING IMPROVED INTERCONNECT STRUCTURE

FIELD OF THE INVENTION

The present invention relates to interconnect and bonding structures for integrated circuit structures.

BACKGROUND OF THE INVENTION

FIG. 1 is a partial schematic view of a prior art integrated circuit structure 400. As those in the art will recognize, an integrated circuit including a transistor or transistors and/or other devices (designated generally at 404) is formed over a silicon substrate 402 having a top surface 401 and a bottom surface 403. A contact etch stop layer (CESL) 405 is formed over the substrate top surface 401 along with a transistor structure and an oxide planarization structure 407. A metallization structure 406, including interconnects (i.e., lines and vias) and inter level dielectric layers (ILDs) is provided over the integrated circuit 404. Although only metal one (M1) and metal two (M2) metallization layers are illustrated, those in the art will understand that integrated circuits often have many more interconnect layers, dependent on device complexity, such as M1 to M9, formed between the device layer 404 and the passivation/bonding structure (not shown).

FIG. 2 is another view of integrated circuit structure 400, showing substrate layer 402 and interconnects layer 406. It should be understood that circuit layer 404, though not shown in FIG. 4, is formed over and/or in the top surface 401 of the substrate 402. A wire bond 408 is shown in partial. Wire bond(s) 408 or conductive bump(s) for flip chip bonding is formed over and connected to the topmost metal layer of interconnect structure 406 as is familiar to those in the art, often through one or more passivation layers.

It is advantageous to use inter level dielectric layers in interconnect structure 406 that are formed from low-K (LK), ultra low-K (ULK), extra low-K (ELK) and XLK materials (collectively, "low-K" dielectric material) in order to gain circuit performance, such as reductions in capacitances between interconnect lines, and thus crosstalk. The material classification is based upon capacitance or k value, with LK usually referring to those materials with a k between about 3.1 to 2.7, ULK usually referring to those materials with a k between about 2.7 to 2.4, and ELK usually referring to those materials with a k between about 2.3 to 2.0. XLK refers to a porous HSQ-based dielectric material available from Dow Corning Corporation (Midland, Mich.) which typically has a k value less than about 2.0. These low K dielectrics, however, have poor mechanical strength and thus tend to crack under stresses induced during bonding techniques, e.g., formation of wire bonds 408 or conductive bumps. Further, mechanical strength, and thus the instances of cracking, deteriorates with increased numbers of metallization layers in interconnect structure 406. Further, with increased numbers of layers, connection wire lengths increase yielding higher resistance (R), and thus higher RC delay, which lowers the device speed.

Therefore, an improved interconnect structure and method of forming the same are desired.

SUMMARY OF THE INVENTION

An improved integrated circuit structure. The integrated circuit structure comprises a substrate, the substrate having a top surface and a bottom surface. The top surface has a circuit device formed thereon. The structure includes a plurality of metallization layers, a bonding structure formed over the bottom surface and a conductive interconnect structure formed through said substrate.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

An improved interconnect structure and bonding scheme layout for integrated circuits is described in connection with FIGS. 3-5.

Figure 1:
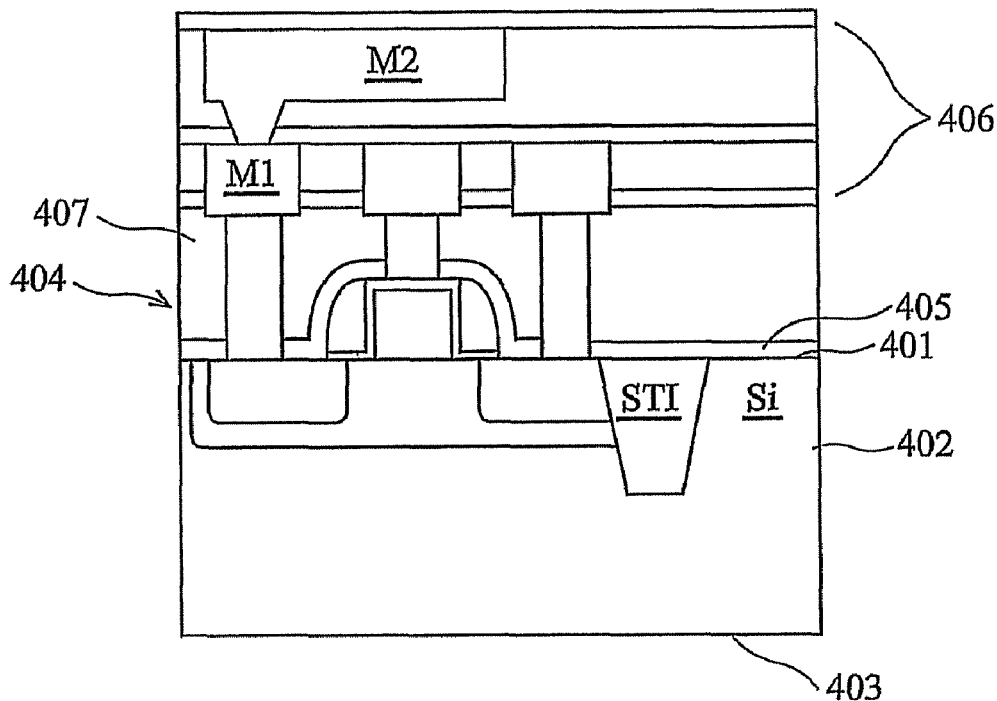
FIGS. 1 and 2 are schematic views illustrating a prior art configuration for an integrated circuit structure and circuit structure with wire bond.
Figure 2:
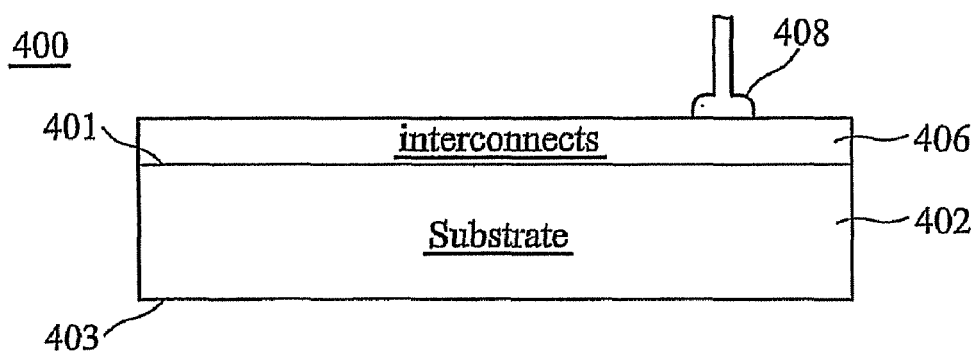
Figure 3:
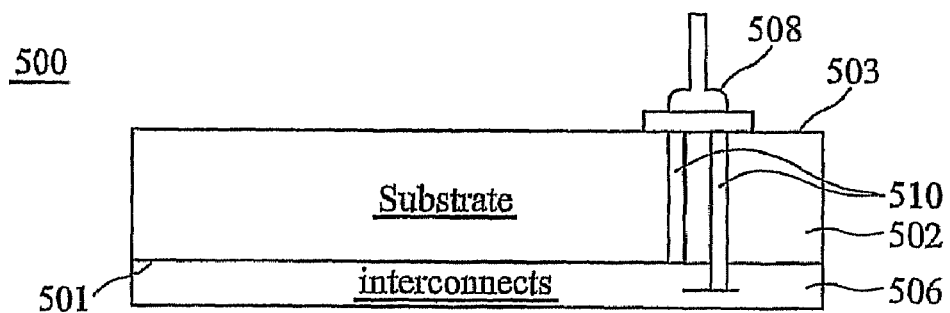
FIGS. 3-5 are schematic views illustrating embodiments of a new interconnect structure and bonding scheme.

FIG. 3 is a schematic illustration of an integrated circuit structure 500 according to one embodiment where the bonding architecture has been moved from over the interconnect structure 506 formed over the top surface 501 (shown facing downward) of the substrate 502. Specifically, the bonding structure is formed on or over the bottom surface 503 (shown facing up) of the substrate 502 rather than the top surface 501. In order to facilitate this bonding approach, conductive connection structures or interconnects 510 are formed through the substrate 502 to the device layer 504 (see FIG. 5) and/or interconnects (e.g., metallization layers) of interconnects layer 506. The interconnects 510 comprise vias filled with conductive material, such as tungsten, copper, or aluminum and are coupled at bottom surface 503 to a bonding structure, such as a bond pad and soldered bond wire structure 508, or solder bump structure, along with any necessary passivation layer(s). In this manner, the bonding structure is formed on the robust substrate surface 503 rather than on the more fragile interconnect structure 506, which preferably includes the fragile low-K dielectric inter level dielectrics. The substrate 502 can be thinned to have a thickness between about 2-10 mils, and preferably between about 2-6 mils, to facilitate the creation of high aspect ratio interconnects 510.

Figure 4:
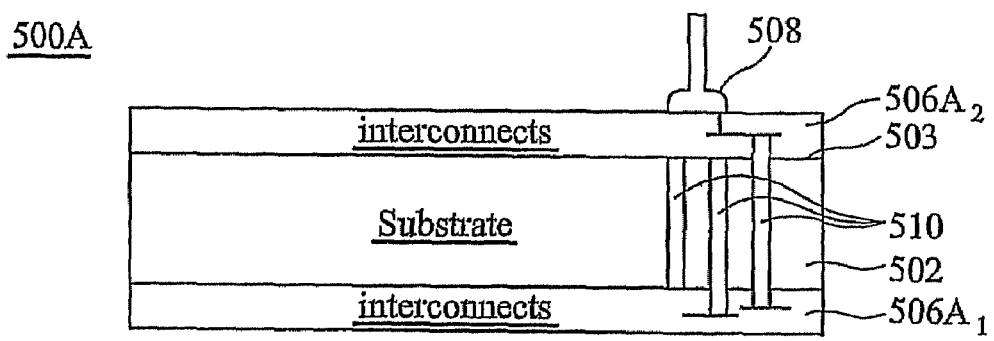

FIG. 4 is a schematic illustration of an integrated circuit 500A representing an alternative embodiment of the integrated circuit 500 of FIG. 3. The integrated circuit 500A of FIG. 4 is identical to the integrated circuit of FIG. 3 except that the interconnect structure 506 of FIG. 3 has been split into two interconnect structures 506A1 and 506A2. The bonding structure 508 is formed over interconnect layer 506A2, which is formed over the bottom surface 503 of the substrate 502. In essence, a part of the interconnect structure is formed over or on the back surface 503 of the substrate 502 and removed from over the top surface 501 (and thus from over the circuit structure formed over/in the substrate 502) of the substrate 502. By way of example, assuming the integrated circuit structure 500A includes nine metal layers (M1-M9), interconnect layers 506A1 and 506A2 could be configured as follows:

| Interconnect Layer 506A1 | Interconnect Layer 506A2 |
|---|---|
| M1 | M2-M9 |
| M1-M2 | M3-M9 |
| M1-M3 | M4-M9 |
| M1-M4 | M5-M9 |
| M1-M5 | M6-M9 |
| M1-M6 | M7-M9 |
| M1-M7 | M8-M9 |
| M1-M8 | M9 |

FIG. 4 shows that interconnects 510 are provided through the substrate 502 to connect the interconnect layers 506A1, 506A2, device layer and bond structure 508 as necessary.

The designer can select the combination of interconnect layers between interconnect layer 506A1 and 506A2 dependent upon such considerations as the number of metallization layers, the strength of the LK material used or other considerations. By moving bonding structure 508 to the backside surface of the substrate, the bonding structure does not apply stress to the circuit device formed proximate to and/or in the front surface 501 of the substrate 502. Further, by moving at least a portion of the interconnect structure to the backside surface 503 of the substrate, the thickness of the respective interconnect structures 506A1 and 506A2, which utilize fragile low-K dielectric inter level dielectric layers, can be reduced. As explained above, the stability and resistance to cracking of the inter level dielectric layers is inversely related to the number of layers provided.

Although not shown in the table but as discussed above, FIG. 3 also illustrates that the interconnect structure 506 can be formed entirely over the top side surface 501 of the substrate 506, as is convention, but with the bonding structure 508 formed over the bottom surface 503 and with conductive interconnects 510 connecting the bonding structure 508 to the metal interconnect layers 506 and the device.

Figure 5:
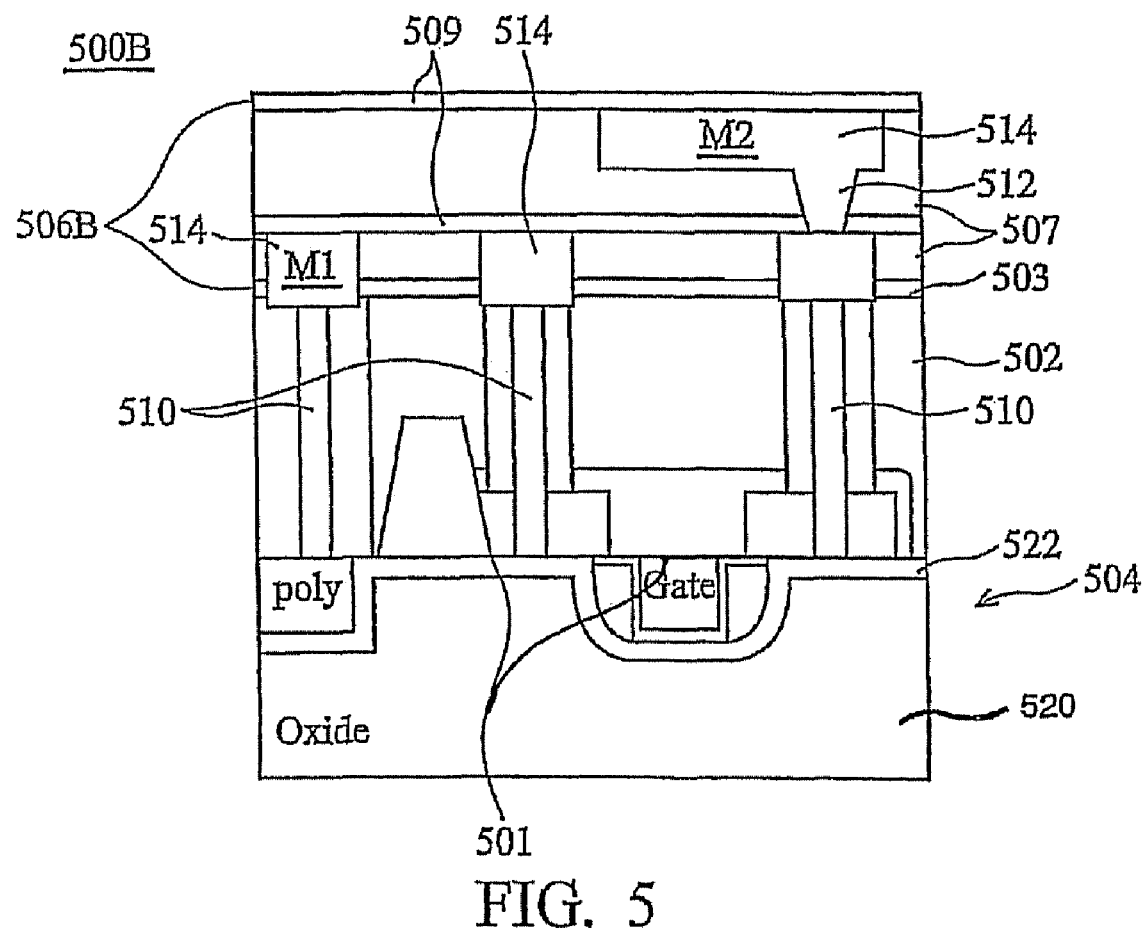

FIG. 5 illustrates a more detailed partial schematic view of an integrated circuit 500B where at least part of the metallization structure 506B (here M1 and M2 as shown) has been moved from over the circuit device 504 to over the backside surface 503 of the substrate 502. Substrate 502 preferably comprises a silicon substrate although other semiconductor substrates, such as silicon-germanium substrate, III-V compound substrate, or silicon on insulator (SOI) substrate may be utilized in embodiments. A circuit device 504, illustrated as a transistor and a polysilicon line, is formed over the top surface 501 of substrate 502 as is convention. As those in the art will understand, the device layer 504 includes one or more transistors, such as MOS transistors or other structure. The device layer functionally can be, for example, a memory layer, a power device, an ASIC (application specific integrated circuit), processor or other functional device. It should be understood that the substrate 502 is shown upside down, so that surface 503 is the bottom side of the substrate 502 and surface 501 is the top side of substrate 502. As is conventional, an oxide layer 520 and contact etch stop layer 522 are formed over the circuit device 504. As discussed above, however, at least some of the metallization layers including the low K inter level dielectric layers has been moved from over the oxide layer 520 to underneath the substrate 502, e.g., on the bottom surface 503 of the substrate 502.

The metallization layers (shown as M1 and M2) are connected to the circuit device 504 through conductive vias or interconnects 510 formed through the substrate 502. The interconnections may have a dielectric insulating layer or diffusion barrier layer formed on sidewalls thereof. Techniques for etching vias and forming conductive interconnects are familiar to those in the art and, therefore, are not detailed herein. In order to facilitate the connection between the device layer 504 and the interconnect layer 506B, the wafer substrate 502 can be thinned by etching or grinding to a thickness of, for example, between about 2-10 mils.

The metallization layers 506B can be formed using conventional process techniques, such as damascene techniques, which are familiar to those in the art and need not be detailed herein. These process techniques form barrier layers 509 when necessary, form inter level dielectric layers 507, etch vias 512 and lines 514 and fill the etched vias and lines with conductive materials, such as W, Al, AlCu and copper. Exemplary combinations of conductive material and inter level dielectric materials are as follows: Cu/LK, Cu/ELK, Cu/FSG (fluorine doped silicate glass), Al/Oxide, etc. A carrier substrate can be temporarily bonded to the oxide layer 520 in order to secure the structure during these processing steps.

It is contemplated, as shown in for example FIG. 5, that the entirety of the interconnect structure (e.g., M1-Mn) could be formed over the bottom surface 503 of the substrate 502, followed by formation of the bonding structure 508 (not shown in FIG. 5). Though the bonding structure 508 (see FIGS. 3 and 4) in this embodiment may provide stresses to the interconnect structure layers 506B, those stresses are not transferred to the device layer 504, which is formed proximate to the top surface 501 of the substrate 502, and therefore does not adversely affect the device performance.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. An integrated circuit structure comprising:
   a semiconductor substrate, said semiconductor substrate having a top surface at a topside of the semiconductor substrate and a bottom surface at a bottom side of the semiconductor substrate, said semiconductor substrate having a transistor device layer formed at the top surface thereof;
   a plurality of metallization layers electrically coupled to said transistor device layer;
   a bonding structure formed over said bottom surface at the bottom side of the semiconductor substrate, the bonding structure including at least one of a solder bump and a wire bond; and
   a conductive interconnect structure formed through said semiconductor substrate and electrically coupled to said bonding structure.

2. The integrated circuit structure of claim 1, wherein said conductive interconnect structure electrically couples said bonding structure to said transistor device layer.

3. The integrated circuit structure of claim 1, wherein at least some of said metallization layers are formed over said bottom surface of said semiconductor substrate at the bottom side of the semiconductor substrate.

4. The integrated circuit structure of claim 3, wherein at least some of said metallization layers are formed over said top surface of said semiconductor substrate at the topside of the semiconductor substrate.

5. The integrated circuit structure of claim 1, wherein said metallization layers comprise conductive vias and lines formed within inter level dielectric layers.

6. The integrated circuit structure of claim 5, wherein said inter level dielectric layers comprise low-K dielectric materials.

7. The integrated circuit structure of claim 1, wherein said conductive interconnect structure comprises at least one conductive via formed through said semiconductor substrate.

8. The integrated circuit structure of claim 7, wherein said conductive material comprises copper, tungsten or aluminum.

9. The integrated circuit structure of claim 4, wherein said conductive interconnect structure electrically couples together at least two metallization layers.

10. The integrated circuit of claim 1, wherein said bonding structure comprises only wire bonds.

11. The integrated circuit structure of claim 1, wherein said semiconductor substrate has a thickness between about 2-10 mils.

12. An integrated circuit structure comprising:
a semiconductor substrate, said semiconductor substrate having a top surface at a topside of the semiconductor substrate and a bottom surface at a bottom side of the semiconductor substrate, said semiconductor substrate top surface having a circuit device layer formed at the top surface thereof;
a plurality of metallization layers electrically coupled to said circuit device layer and comprising conductive vias and lines formed within low-K dielectric inter level dielectric layers;
a bonding structure formed over said bottom surface of said semiconductor substrate at the bottom side of the semiconductor substrate, the bonding structure including one or more solder bumps or wire bonds for making external electrical connections to said integrated circuit, wherein all of said external electrical connections to said integrated circuit are made through the bonding structure; and
a conductive interconnect structure formed through said semiconductor substrate, said conductive interconnect structure comprising at least one conductive via formed through said semiconductor substrate, wherein said conductive interconnect structure electrically couples said bonding structure to said circuit device layer.

13. The integrated circuit structure of claim 12, wherein said semiconductor substrate has a thickness between about 2-10 mils.

14. The integrated circuit structure of claim 12, wherein at least some of said metallization layers are formed over said bottom surface of said semiconductor substrate at the bottom side of the semiconductor substrate between the bonding structure and the bottom side of the semiconductor substrate.

15. The integrated circuit structure of claim 14, wherein at least some of said metallization layers are formed over said top surface of said semiconductor substrate at the topside of the semiconductor substrate.

16. The integrated circuit structure of claim 12, wherein said conductive vias comprise copper, tungsten or aluminum.

17. The integrated circuit structure of claim 12, wherein all of said metallization layers are formed over said bottom surface of said semiconductor substrate at the bottom side of the semiconductor substrate between the bonding structure and the bottom side of the semiconductor substrate.

18. The integrated circuit structure of claim 12, wherein said conductive interconnect structure electrically couples at least two metallization layers together, said at least two metallization layers comprising a first metallization layer formed over a top surface of said semiconductor substrate at the topside of the semiconductor substrate and a second metallization layer formed over a bottom surface of said semiconductor substrate at the bottom side of the semiconductor substrate.

19. The integrated circuit structure of claim 12, wherein said bonding structure comprises only wire bonds.

20. The integrated circuit structure of claim 12, wherein said conductive interconnect structure is coupled between said circuit device layer and a metallization layer from said plurality of metallization layers.

21. An integrated circuit device comprising:
a semiconductor substrate, said semiconductor substrate having a top surface at a topside of the semiconductor substrate and a bottom surface at a bottom side of the semiconductor substrate, said semiconductor substrate having a circuit device layer formed at the top surface thereof;
a plurality of metallization layers electrically coupled to said circuit device layer and comprising conductive vias and lines formed within low-K inter level dielectric layers, said metallization layers being disposed at the topside of the semiconductor substrate over the circuit device layer;
a bonding structure disposed at the bottom side of the semiconductor substrate on the bottom surface of the semiconductor substrate, the bonding structure including one or more solder bumps or wire bonds for making external electrical connections to said integrated circuit, wherein all of said external electrical connections to said integrated circuit are made through the bonding structure at the bottom surface of the semiconductor substrate; and
a conductive interconnect structure formed through said semiconductor substrate, said conductive interconnect structure comprising at least one conductive via formed through said semiconductor substrate, wherein said conductive interconnect structure electrically couples said bonding structure to at least one of said circuit device layer and a metallization layer at the topside of the semiconductor substrate.

* * * * *